United States Patent [19]
Huang

[11] Patent Number: 5,930,591
[45] Date of Patent: Jul. 27, 1999

[54] HIGH RESOLUTION, LOW VOLTAGE FLAT-PANEL RADIATION IMAGING SENSORS

[75] Inventor: Zhong Shou Huang, Mississauga, Canada

[73] Assignee: Litton Systems Canada Limited, Rexdale, Canada

[21] Appl. No.: 08/841,492

[22] Filed: Apr. 23, 1997

[51] Int. Cl.⁶ .......................... M01L 21/00; M01L 21/84
[52] U.S. Cl. .............................. 438/36; 438/160; 438/166
[58] Field of Search ...................... 438/166, 160, 438/36, 589; 250/208.1; 257/443, 445, 428, 440

[56] References Cited

U.S. PATENT DOCUMENTS

| | | |
|---|---|---|
| 4,382,187 | 5/1983 | Fraleux et al. . |
| 4,689,487 | 8/1987 | Nishiki et al. . |
| 5,079,426 | 1/1992 | Antonuk et al. . |
| 5,352,897 | 10/1994 | Horikawa et al. .................. 250/370.06 |
| 5,426,292 | 6/1995 | Bird et al. .............................. 250/208.1 |

OTHER PUBLICATIONS

"New Solid State Image Pickup Devices Using Photosensitive Chalcogenide Glass Film" T. Tsukada et al., published in the Proceedings of IEEE International Electron Devices Meeting, 1979, pp. 134–136 month Unknown.

"Digital Radiology Using Self–Scanned Read Out of Amorphous Selenium" W. Zhao et al., presented at COMP91, Canadian Organization of Medical Physicists, Winnipeg, Manitoba, Canada, Jun. 19, 1991.

*Primary Examiner*—John F. Niebling
*Assistant Examiner*—Michael S. Lebentritt
*Attorney, Agent, or Firm*—Fay, Sharpe, Beall, Fagan, Minnich & McKee, LLP

[57] ABSTRACT

In a method of fabricating a high resolution low voltage flat panel radiation imaging sensor having a radiation transducer having a radiation conversion layer of amorphous semiconductor and an electrode on one side thereof and an array of pixels arranged in rows and columns on an opposite side thereof, each pixel including a pixel electrode and storage capacitor and a charge readout device connected to the pixel electrode and the storage capacitor, the improvement comprising the step of shining light on selected regions of the radiation conversion layer which are aligned with the pixel electrodes to thereby crystallize the regions, resulting in a plurality of low resistivity and high charge mobility crystallized regions where the semiconductor material has been exposed to the light surrounded by high resistivity and low charge mobility regions where the semiconductor material has not been exposed to the light, for preventing lateral charge diffusion between respective ones of the low resistivity and high charge mobility regions.

7 Claims, 3 Drawing Sheets

HIGH RESOLUTION, LOW VOLTAGE FLAT-PANEL RADIATION IMAGING SENSORS

FIELD OF THE INVENTION

The present invention relates in general to imaging systems and more particularly to a high resolution, low voltage flat-panel radiation imaging sensor.

BACKGROUND OF THE INVENTION

X-ray imaging systems are widely used in medical diagnosis and industrial and security inspection environments. Various prior art X-ray imaging systems are known, including flat-panel radiation imaging sensors. For example, U.S. Pat. No. 4,382,187 to Fraleux et al and U.S. Pat. No. 4,689,487 to Nashiki et al disclose early designs of large area flat-panel radiation imaging sensors which are responsive to incident X-rays and generate output signals representative of a radiation image.

U.S. Pat. No. 5,079,426 to Antonuk et al discloses an indirect conversion X-ray image sensor incorporating amorphous silicon thin film transistor (TFT) switches and a photodiode array. X-rays are detected by a phosphor screen that is placed on the top of the TFT switches and photodiode array. When X-rays interact with the phosphor film, light photons are generated and converted into electronic charges by the photodiode array. The charges are read out via the TFT switches to generate an image. However, problems exist with this prior art sensor. Because the sensor employs a phosphor screen to detect X-rays, blurring occurs due to the fact that the light photons are emitted in all directions and are scattered inside the phosphor screen. This results in a poor image resolution.

In an article entitled "New Solid State Image Pickup Devices Using Photosensitive Chalcogenide Glass Film" by T. Tsukada et al, published in the Proceedings of IEEE International Electron Devices Meeting, 1979, pages 134–136, a solid state imaging sensor is disclosed including a photoconductive selenium film deposited on a N-channel MOSFET switch array made from crystalline silicon. Although this image sensor is suitable for some imaging applications, it is not suited for large area radiation imaging applications due to the difficulties in fabricating a large sensor array on a crystalline silicon wafer.

In an article entitled "Digital Radiology Using Self-Scanned Read Out of Amorphous Selenium" authored by W. Zhao et al, presented at COMP91, Canadian Organization of Medical Physicists, Winnipeg, Manitoba, Canada, Jun. 19, 1991, a flat panel X-ray image sensor is disclosed. The image sensor includes a thick amorphous selenium film (a-Se) on a two-dimensional TFT switch array. The TFT switches are arranged in rows and columns to form a two-dimensional imaging system. Gate lines interconnect the TFT switches in each row while source lines interconnect the TFT switches in each column. The thick selenium film is deposited directly on top of the TFT switch array and a top electrode is deposited on the selenium film. When X-rays are incident on the selenium film and the top electrode is biased with a high voltage, electron-hole pairs are generated and separated by the electric field across the thickness of the selenium film. The holes are driven by the electric field to the pixel electrodes below, which are connected to the respective TFT switches, and stored in the storage capacitor in each pixel. This process results in a charge image being held by the pixels representing the input x-ray image. The signal charges held by the pixel storage capacitors are read out by supplying a positive pulse to the gate lines. When a gate line receives a pulse, the TFT switches in the row turn on, allowing the signal charges on the pixel electrodes to flow to the source lines. Charge amplifiers connected to the source lines sense the charge and provide output voltage signals proportional to the charge and, hence, proportional to the radiation exposure on the selenium film.

One potential risk associated with the prior art system described above, is that TFT switches and peripheral circuits (e.g. charge amplifier multiplexer gate drivers), are susceptible to improper operation and even permanent damage as a result of the high bias voltage on the x-ray conversion layer. Depending on what type of radiation conversion layer is to be used, the electic field strength necessary to adequately bias the radiation conversion layer can range from five to ten volts per micrometer of thickness. For a typical 300 $\mu$ m thick radiation conversion layer, a three kilovolt bias voltage must be applied. By way of contrast, the gate and bias voltages applied to the TFT switch array and control voltages for peripheral read-out circuitry are typically in the range of from five to ten volts, which is clearly not compatible with the high voltages required to bias the radiation conversion layer.

It is therefore an object of an aspect of the present invention to provide a direct conversion flat panel imaging sensor, which comprises a low voltage driven semiconductor layer for direct radiation conversion and a thin film switch array, and which is capable of providing high sensitivity and high resolution image capture ability.

SUMMARY OF THE INVENTION

According to the present invention, a novel flat-panel imaging sensor is provided with inherent high resolution and low bias voltage for the X-ray conversion layer. The imaging sensor of the preferred embodiment comprises a two-dimensional TFT switch array and X-ray conversion layer deposited over the TFT switch array, via lamination. The X-ray conversion layer is deposited as an amorphous semiconductor material (e.g. amorphous selenium, amorphous silicon, amorphous cadmium selenide, or amorphous cadmium zinc telluride). According to an important aspect of the invention, a subsequent laser recrystallization process is performed by which a laser beam crystallizes the amorphous material through a mask, typically using the metal gate lines and data lines of the TFT switch array as the mask. As a result of the recrystallization process, the X-ray conversion layer becomes a semiconductor film with crystalline or polycrystalline islands in each pixel surrounded by amorphous semiconductor material. By crystallizing the amorphous semiconductor of the radiation conversion layer, the trap density of holes and electrons decreases and the hole and electron mobilities increase. These improvements in carrier transport properties lead to significant increase of Schubweg ($=\mu\tau E$), where $\mu$ represents carrier mobility, $\tau$ represents carrier lifetime and E denotes the electric field in the semiconductor. This increase in Schubweg indicates that the distance free carriers (electrons or holes) can transit in the semiconductor before they are captured by a trapping centre, is increased. In order to efficiently collect signal charge from the semiconductor, the value of Schubweg has to be larger than the film thickness. The improvements in Schubweg of the radiation converion layer allow the application of a much lower top bias voltage to the radiation conversion layer than in prior art systems while keeping the same charge generation and collection efficiency. The employment of low bias voltage not only reduces the risk of high voltage permanent damage to the TFTs and peripheral IC chips, but also mitigates the field stress on electron and hole blocking layers and therefore reduces dark current on the radiation conversion layer. The blocking layers are generally located between contact electrodes and semiconductor films to block current injection from the contact electrodes.

It is known in the art to employ various crystallization techniques to increase carrier mobility and lifetime, to reduce material sensitivity, to condition semiconductor crystal structure and to increase crystalline grain size. However, for photoconductors (or radiation conversion films) continuously deposited on a switch array imaging device, a very high resistivity of about $1 \times 10^{12} \Omega$.cm is generally required for charge retention and to minimize lateral charge diffusion. However, this causes image blurring and loss of image resolution. Resistivity can be characterized generally by $1/(q u N_o)$, where q is elementary charge, $\mu$ is carrier mobility and $N_o$ is carrier density in the dark condition (i.e. only thermal generation). From this expression, a large resistivity can be realized by using semiconductor materials with low mobility and low dark carrier density. Crystalline semiconductor materials with a wide forbidden energy band and less defect density will exhibit low intrinsic carrier density, and therefore high dark resistivity under certain ambient temperatures. However, it is generally difficult to obtain a large area crystalline wafer.

Isolating each pixel's photoconductor with photolithographic processes is a known method to avoid charge diffusion between adjacent pixels, cross-talk and inter-layer shortages. In such processes, low resistivity materials are acceptable but only for very thin films, (e.g. 1~3 $\mu$ m, which is adequate only for visible light detector or imaging sensors). For very thick films, performing the etching process and connecting all of the top electrodes of the photoconductors becomes extremely difficult.

According to the present invention, the above addressed problems can be solved by using a self-aligning crystallization technique on the amorphous semiconductor film deposited on a thin film switch array. According to the preferred embodiment, high quality polycrystal or crystal semiconductor pixel islands are crystallized by laser beams through transparent windows on a shadow mask and are isolated from each other by high resistivity amorphous materials which are not crystallized because the shadow mask blocks the laser beam.

BRIEF DESCRIPTION OF THE DRAWINGS

A detailed description of the preferred embodiment is provided herein below with reference to the following drawings, in which.

DETAILED DESCRIPTION OF THE PREFERRED EMBODIMENT

Figure 1:
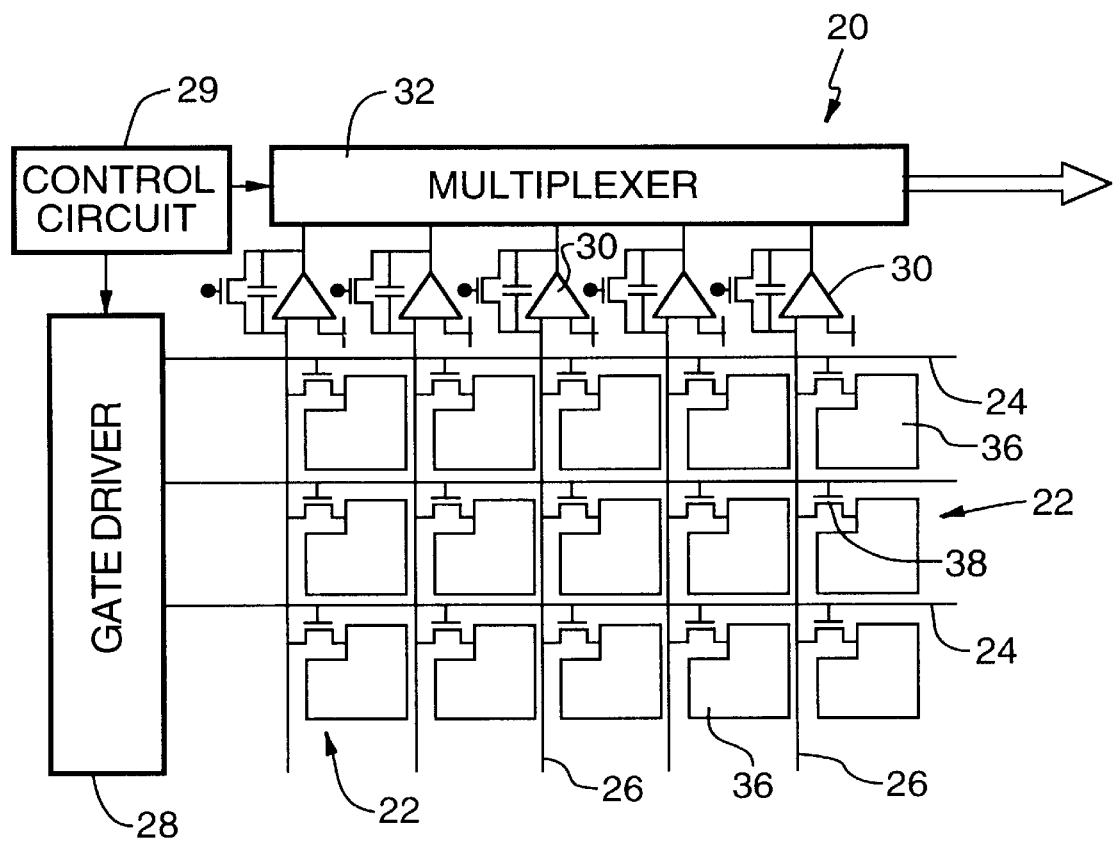
FIG. 1 is a schematic illustration of a flat-panel imaging sensor for radiation imaging, in accordance with the prior art.

Referring now to FIG. 1, a flat panel imaging sensor for radiation imaging is shown and is generally indicated by reference numeral 20. The flat panel imaging sensor includes a plurality of pixels 22 arranged in rows and columns. Gate lines 24 interconnect the pixels 22 of each column. The gate lines 24 lead to gate driver circuit 28 which provides pulses to the gate lines in succession in response to input from an control circuit 29. The source lines 26 lead to charge amplifiers 30 which in turn are connected to a multiplexer 32. The charge amplifiers 30 convert signal charges of the pixels on selected rows into signal voltages. The multiplexer scans the output terminals of each charge amplifier in a sequence synchronized by a clock control function of circuit 29, and provides a temporal video signal which can be digitized to create, in digital format, a radiation image via subsequent circuitry.

Figure 2:
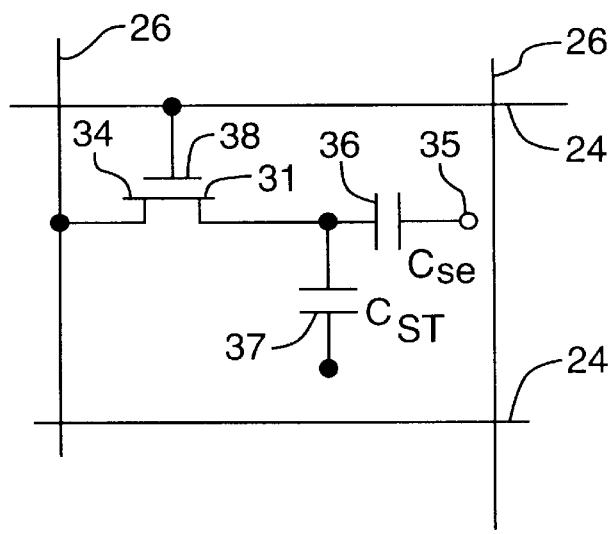
FIG. 2 is an equivalent circuit of a pixel forming part of the flat panel imaging detector illustrated in FIG. 1.

FIG. 2 shows an equivalent circuit of one of the pixels 22. As can be seen, the pixel includes a radiation transducer $C_{se}$ coupled to a storage capacitor $C_{ST}$. The radiation transducer $C_{se}$ comprises a radiation conversion layer 33 bounded by top electrode 35 and pixel electrode 36. The storage capacitor $C_{ST}$ comprises the pixel electrode 36 and a storage capacitor plate 37, which are separated by one or more dielectric layers. In the preferred embodiment shown, the storage electrode plate 37 is connected to the gate line 24. As an alternative to the illustrated arrangement of plate 37, the plate can be an independent line running in parallel with gate lines 24, and routed to the common ground of the imaging device at its end, as needed. The pixel electrode 36 is connected to the drain electrode 31 of a thin film transistor (TFT). The source electrode 34 is coupled to one of the source lines 26 while the gate electrode 38 is coupled to one of the gate lines 24. A layer of semiconductor material 39 (e.g. CdSe) is deposited between the source and drain regions in a well known manner.

When the radiation transducer $S_{se}$ is biased via top electrode 35 and is exposed to radiation, the pixel electrode 36 collects charge proportional to the exposure of the radiation transducer to radiation. The accumulated charge on storage capacitor $C_{ST}$ can be read by supplying a gating pulse to the gate terminal 38 of the TFT switch. When the TFT switch receives the gating pulse, it connects the pixel electrode 36 to the source line 26 allowing the storage capacitor $C_{ST}$ to discharge. The charge on the source line 26 is detected by the charge amplifier 30 which in turn generates an output voltage proportional to the detected charge. The output voltage of the charge amplifier 30 is conveyed to the analog multiplexer 32.

Figure 3:
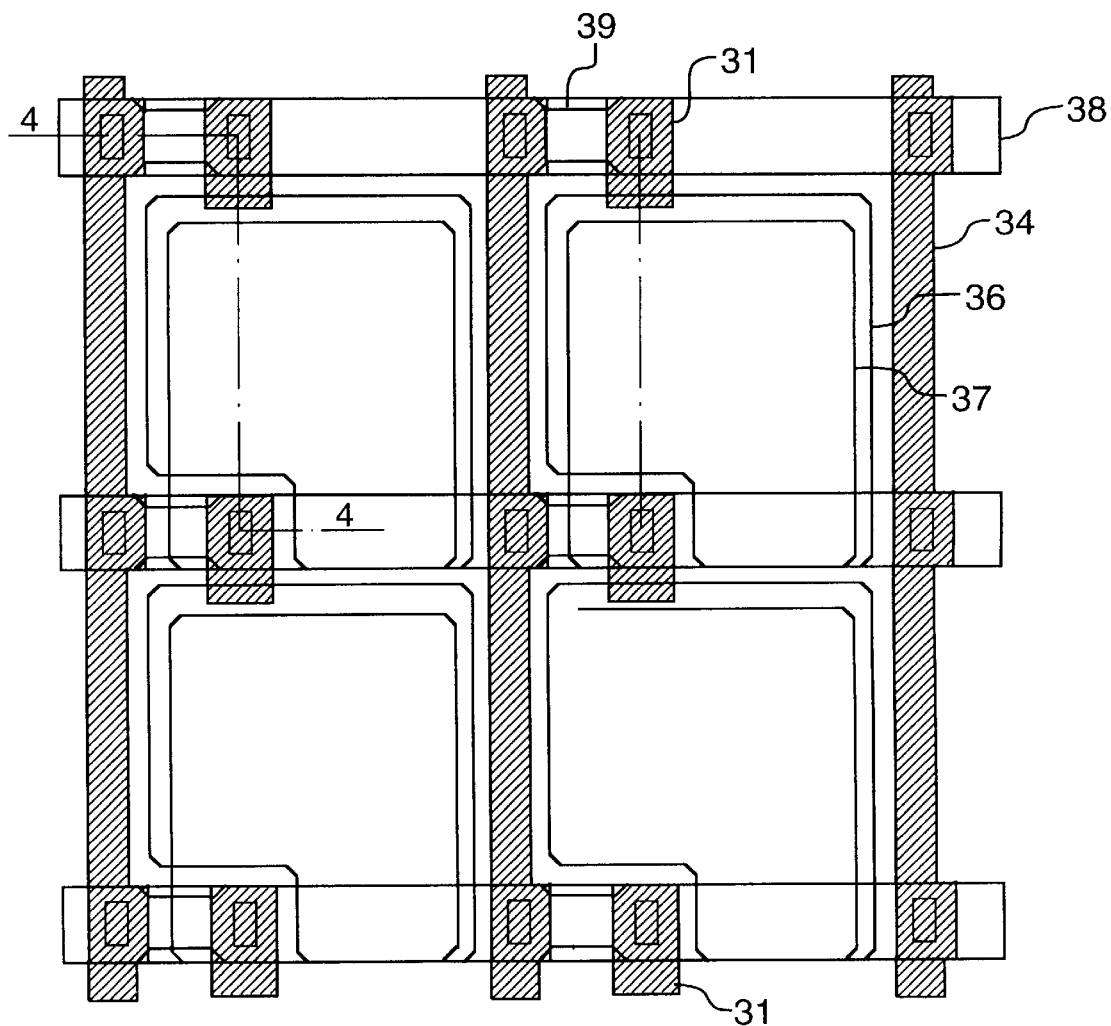
FIG. 3 is a top plan view of a portion of a flat panel imaging sensor fabricated in accordance with the principles of the present invention.
Figure 4:
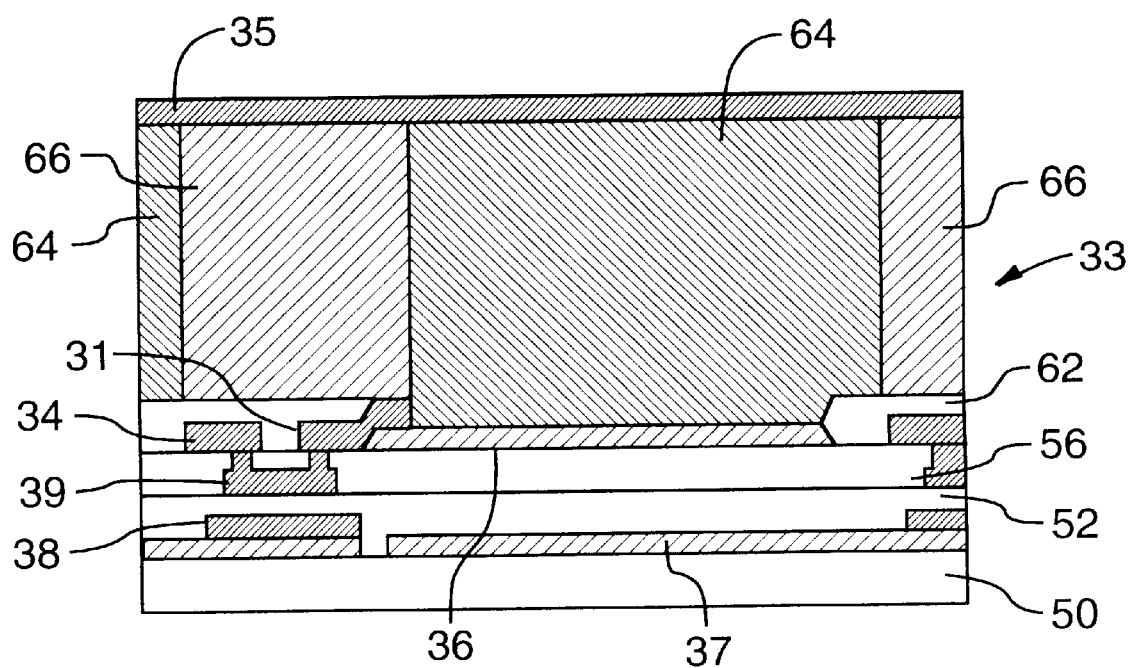
FIG. 4 is cross-sectional view of FIG. 3 taken along the line 4—4.

Referring now to FIGS. 3 and 4, a portion of the array of pixels 22 formed in accordance with the present invention is shown. As shown in FIG. 3, during the laser crystallization process, the dotted area (gate lines 38) and shadow area (data lines 34 and drain electrodes of TFT 31) are opaque zones, where the amorphous semiconductor film which is deposited on the TFT active matrix is not impinged upon by the laser and therefore remains as a high resistivity amorphous structure. The pixels 22, including the gate and source lines 24 and 26, are fabricated on a common glass substrate 50. Deposited on the substrate 50 are the transparent storage capacitor plates 37 (typically fabricated from indium tin oxide (ITO or $SnO_2$)) and the chromium gate lines 24 connected to individual gate electrodes 38. A gate insulating layer 52 formed of $SiO_2$ or $SiN_x$ overlies the substrate 50 and the gate lines.

A semiconductor layer 39, formed of cadmium selenide (CdSe) is deposited on the gate insulating layer 52 above the gate lines, defining the channels of each TFT switch. A passivation layer 56 in the form of an $SiO_2$ layer overlies the gate insulating layer 52 and the TFT channel. Transparent pixel electrode 36 (also typically fabricated from ITO) is deposited on the passivation layer 56. Drain and source electrodes 31 and 34, respectively, are then deposited in a well known manner so as to overly the passivation layer 56 and, in the case of the drain electrode, to contact the pixel electrode 36.

A top passivation layer 62 in the form of $SiO_2$, SiN or other type of dielectric material, is deposited on the TFT panel and patterned to open contact windows at each pixel so that the majority of the pixel electrode 36 associated with each TFT switch remains exposed to the radiation conversion layer 33.

The top electrode 35 formed above the radiation conversion layer is preferably fabricated from ITO, $SnO_2$, In, Al or Au. The top electrode 35 is coupled to a voltage source which provides a stable, adequate electric field across the radiation conversion layer. Depending on the semiconductor material and crystallinity after laser crystallization treatment, the bias voltage required to ensure that Schubweg ($=\mu\tau E$) is sufficient for a given film thickness of photoconductor, can be reduced to one tenth of the voltage required in prior art systems. For instance, with amorphous silicon deposited using plasma enhanced chemical vapour deposition, electron mobility is typically in the range of from 0.2 to 1 $cm^2/v.s.$, and the carrier life-time is approximately $2 \times 10^{-7}$ s. To ensure that the photogenerated charge reaches the collection electrode (i.e. the pixel electrode in the flat panel imaging sensors) through the 300 $\mu$ m thick film, without recombination with holes or being captured by traps, the bias voltage calculated from the equation $Vb = L^2/(\mu\tau)$ must be in the order of 4500 volts. After the crystallization process of the present invention, amourphous silicon becomes either polysilicon or micro-crystalline silicon, and electron mobility increases to over ten times larger than that of amourphous silicon (e.g. from 0~400 $cm^2/v.s.$ to a mobility in the bulk of crystalline silicon of about 1500 $cm^2/v.s.$). As another example, for amorphous selenium film, which is a known radiation conversion layer frequently used in radiography, the hole mobility is about 0.13 $cm^2/v.s.$, whereas after laser crystallization it increases to about 27 $cm^2/v.s.$ The carrier lifetimes also generally increase after crystallization, because the trap density inside the crystal gains is much less than that of amourphous material. Therefore, a bias voltage of only 100 volts is typically sufficient to bias the electrode 35 for a 300 $\mu$ m thick radiation conversion layer.

As discussed briefly above, in accordance with the present invention, a laser beam is used to crystallize the amorphous material through a metal mask formed from the gate lines 24 and source lines 26, such that the X-ray conversion layer 33 becomes characterized by crystalline or polycrystalline islands 64 in each pixel which are surrounded by amorphous semiconductor barriers 66. During the laser recrystallization procedure, only those regions of the amorphous film which are not masked by the gate and source lines are illuminated by the laser and therefore crystallized.

In order to obtain high quality and uniform crystallization across the entire thickness of the radiation image detector film 33, it is preferred that a long wave length laser beam be utilized, thereby avoiding high reflectivity and absorption of the semiconductor material as it becomes crystallized. The laser power and operation mode (pulse duration, etc.) must be optimizized according to the physical properties and film thickness of the amourphous semiconductor material to ensure highly reliable crystallinzation but not be too strong to damage or burn out the metal mask lines. For instance, 100~100 $mJ/cm^2$ would be adequate for amorphous silicon film, and 20–500 $mJ/cm^2$ would be adequate for amourphous selenium film. The wavelength of the laser beam must be greater than the absorbed edge of the absorption spectrum of the crystallized material, which is determined by its energy band gap and should be optimized in accordance with the energy band gap of the crystallized materials for given film thickness. This is a very important requirement, to reduce bulk absorption and surface reflection in the crystallized film, and to ensure that the laser beam penetrates into the entire amorphous film and crystallizes it. For instance, a carbon-dioxide-laser which has 10.6 $\mu$ m wavelength and is collimated by a germanium lens, can be used for this purpose. The amorphous material 66 is characterized by a typical resistivity in the range of $10^{10}$~$10^{13}$ $\Omega.cm$, whereas the crysallized material 64 is characterized by a resistivity in the range of approximatel $10^7$~$10^{11}$ $\Omega.cm$.

In operation, a bias voltage is applied to the top electrode 35. The bias voltage must be sufficient to separate electron-hole pairs generated by X-ray or other radiation in the crystalline or polycrystalline material 64, and to move these charges toward the top electrode 35 and pixel electrode 36. However, the bias voltage applied to the top electrode 35 according to the present invention is significantly smaller than that required in the prior art as a result of the low resistivity crystalline or polycrystalline islands 64. Since these low resistivity crystalline or polycrystalline islands 64 are isolated by the high resistivity amorphous barriers 66, lateral charge diffusion in the bulk and surface of the X-ray conversion layer 33 which can cause image blurring, is completely eliminated.

Alternative embodiments of the invention are possible. For example, the laser recrystallization can also be applied to the structure of the present invention using a separate mask in the form of a high reflectivity metal matrix applied to the top surface of the structure, either before deposition of the top electrode 35 or after deposition of the electrode 35, provided that the electrode is transparent. This alternative embodiment and such other alternative embodiments and variations are believed to be within the sphere and scope of the present invention as defined by the claims hereto.

The embodiments of the invention in which an exclusive property of privelege is claimed are defined as follows:

1. In a method of fabricating a high resolution low voltage flat panel radiation imaging sensor having a radiation transducer having a radiation conversion layer of amorphous semiconductor and an electrode on one side thereof and an array of pixels arranged in rows and columns on an opposite side thereof, each pixel including a pixel electrode and storage capacitor and a charge readout device connected to said pixel electrode and said storage capacitor, the improvement comprising the step of irradiating selected regions of said radiation conversion layer which are aligned with said pixel electrodes to thereby crystallize said regions, resulting in a plurality of low resistivity and high charge mobility crystallized regions where said semiconductor material has been exposed to said irradiation surrounded by high resistivity and low charge mobility regions where said semiconductor material has not been exposed to said irradiation, for preventing lateral charge diffusion between respective ones of said low resistivity and high charge mobility regions.

2. The improvement of claim 1, wherein said pixel electrode and said storage capacitor are transparent to said irradiation, said charge read-out device is opaque to said irradiation, and said irradiation is performed on said radiation conversion layer from said opposite side such that said high resistivity and low charge mobility regions are masked from said irradiation.

3. The improvement of claim 1, wherein said electrode is transparent, a high reflectivity mask is applied to said electrode on said one side, and said irradiation is performed on said radiation conversion layer from said one side such that said high resistivity and low charge mobility regions are masked from said irradiation by said a high reflectivity mask.

4. The improvement of claim 1, wherein a high reflectivity mask is applied to said electrode on said one side prior to depositing said electrode, and said irradiation is performed on said radiation conversion layer from said one side such that said high resistivity and low charge mobility regions are masked from said irradiation by said a high reflectivity mask.

5. The improvement of claim 1, wherein said amorphous semiconductor material is fabricated from one of either amorphous selenium, amorphous silicon, polycrystal or amorphous cadmium selenite, polycrystal or amorphous zinc sulphite and zinc selenite, polycrystal or amorphous cadmium zinc telluride.

6. The improvement of claim 2, wherein said charge read-out device is one of either a thin film transistor or thin film diode having metal portions which are opaque to said irradiation.

7. The improvement of claim 1, wherein said irradiation is characterized by a wavelength longer than the intrinsic absorbed edge of the absorption spectra of said crystallized regions as determined by the energy band gaps of said crystallized regions.

* * * * *

UNITED STATES PATENT AND TRADEMARK OFFICE
CERTIFICATE OF CORRECTION

PATENT NO. : 5,930,591
DATED : 07/27/99
INVENTOR(S) : HUANG, Zhong

It is certified that error appears in the above-identified patent and that said Letters Patent is hereby corrected as shown below:

On the cover page, Item [73]Assignee:

-- 1294339 Ontario, Inc.
Toronto, Ontario, Canada --.

Signed and Sealed this

Twentieth Day of June, 2000

Attest:

Q. TODD DICKINSON

*Attesting Officer*  *Director of Patents and Trademarks*